(12) United States Patent
Trzasko et al.

(10) Patent No.: US 8,310,233 B2
(45) Date of Patent: Nov. 13, 2012

(54) METHOD FOR IMAGE RECONSTRUCTION FROM UNDERSAMPLED MEDICAL IMAGING DATA

(75) Inventors: Joshua D Trzasko, Rochester, MN (US); Armando Manduca, Rochester, MN (US)

(73) Assignee: MAYO Foundation for Medical Education and Research, Rochester, MN (US)

( * ) Notice: Subject to any disclaimer, the term of this patent is extended or adjusted under 35 U.S.C. 154(b) by 481 days.

(21) Appl. No.: 12/705,818

(22) Filed: Feb. 15, 2010

(65) Prior Publication Data

US 2010/0207629 A1  Aug. 19, 2010

Related U.S. Application Data

(60) Provisional application No. 61/153,407, filed on Feb. 18, 2009.

(51) Int. Cl.
*G01V 3/00* (2006.01)
*G06K 9/00* (2006.01)

(52) U.S. Cl. ......... 324/309; 324/307; 382/128; 382/131

(58) Field of Classification Search ............ 324/309, 324/307, 306, 312; 128/128, 131, 132
See application file for complete search history.

(56) References Cited

U.S. PATENT DOCUMENTS

| | | | |
|---|---|---|---|
| 8,194,937 B2 * | 6/2012 | Chen | 382/118 |
| 2009/0274355 A1 * | 11/2009 | Chen et al. | 382/131 |
| 2010/0322497 A1 * | 12/2010 | Dempsey et al. | 382/131 |
| 2011/0006768 A1 * | 1/2011 | Ying et al. | 324/309 |
| 2012/0027280 A1 * | 2/2012 | Giraldo et al. | 382/131 |

\* cited by examiner

*Primary Examiner* — Louis Arana
(74) *Attorney, Agent, or Firm* — Qurles & Brady, LLP

(57) ABSTRACT

A method for image reconstruction that utilizes a generalization of compressed sensing is provided. More particularly, a method for homotopic $l_0$ minimization is provided, in which a series of subproblems that asymptotically approach a solution to the $l_0$ minimization are iteratively solved. These subproblems include utilizing concave metric prior functionals in the traditional compressed sensing framework. Substantially undersampled image data is acquired from a subject, for example, with a medical imaging system, such as a magnetic resonance imaging ("MRI") system or a computed tomography ("CT") system. Using the provided method, undersampling on the order of around 96 percent can be achieved while still producing clinically acceptable images.

19 Claims, 4 Drawing Sheets

METHOD FOR IMAGE RECONSTRUCTION FROM UNDERSAMPLED MEDICAL IMAGING DATA

CROSS-REFERENCE TO RELATED APPLICATIONS

This application claims the benefit of U.S. Provisional Patent Application Ser. No. 61/153,407 filed on Feb. 18, 2009, and entitled "Method for Image Reconstruction from Undersampled Medical Imaging Data."

BACKGROUND OF THE INVENTION

The field of the invention is medical imaging and particularly, methods for reconstructing images from acquired image data.

Magnetic resonance imaging ("MRI") uses the nuclear magnetic resonance ("NMR") phenomenon to produce images. When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently used to produce medical images require many minutes to acquire the necessary data. The reduction of this scan time is an important consideration, since reduced scan time increases patient throughput, improves patient comfort, and improves image quality by reducing motion artifacts. Many different strategies have been developed to shorten the scan time.

In an x-ray computed tomography ("CT") system, an x-ray source projects a fan-shaped beam that is collimated to lie within an x-y plane of a Cartesian coordinate system, termed the "image plane." The x-ray beam passes through the object being imaged, such as a medical patient, and impinges upon an array of radiation detectors. The intensity of the transmitted radiation is dependent upon the attenuation of the x-ray beam by the object and each detector produces a separate electrical signal that is a measurement of the beam attenuation. The attenuation measurements from all the detectors are acquired separately to produce what is called the "transmission profile," or "attenuation profile," or "projection."

The source and detector array in a conventional CT system are rotated on a gantry within the imaging plane and around the object so that the angle at which the x-ray beam intersects the object constantly changes. The transmission profile from the detector array at a given angle is referred to as a "view" and a "scan" of the object comprises a set of views made at different angular orientations during one revolution of the x-ray source and detector. In a 2D scan, data is processed to construct an image that corresponds to a two dimensional slice taken through the object. The prevailing method for reconstructing an image from 2D data is referred to in the art as the filtered backprojection technique. This image reconstruction process converts the attenuation measurements acquired during a scan into integers called "CT numbers," or "Hounsfield units," which are used to control the brightness of a corresponding pixel on a display.

According to standard image reconstruction theories, in order to reconstruct an image without aliasing artifacts, the sampling rate employed to acquire image data must satisfy the so-called Nyquist criterion, which is set forth in the Nyquist-Shannon sampling theorem. Additionally, in standard image reconstruction theories, no specific prior information about the image is needed. On the other hand, when some prior information about the desired, or target, image is available and appropriately incorporated into the image reconstruction procedure, an image can be accurately reconstructed even if the Nyquist criterion is violated. For example, in parallel-beam CT imaging, if one knows that a desired target image is circularly symmetric and spatially uniform, only one projection view of parallel-beam projections is necessary to accurately reconstruct the linear attenuation coefficient of the object. As another example, if one knows that a desired target image consists of only a single point, then only two orthogonal projections that intersect at that point are needed to accurately reconstruct the image point.

Thus, if prior information is known about the desired target image, such as if the desired target image is a set of sparsely distributed points, it can be reconstructed from a set of data that was acquired in a manner that does not satisfy the Nyquist criterion. Put more generally, knowledge about the sparsity of the desired target image can be employed to relax the Nyquist criterion; however, it is a highly nontrivial task to generalize these arguments to formulate a rigorous image reconstruction theory.

The Nyquist criterion serves as one of the paramount foundations of the field of information science. However, it also plays a pivotal role in modern medical imaging modalities such as MRI and x-ray CT. When the number of data samples acquired by an imaging system is less than the requirement imposed by the Nyquist criterion, artifacts appear in the reconstructed images. In general, such image artifacts include aliasing and streaking artifacts. In practice, the Nyquist criterion is often violated, whether intentionally or through unavoidable circumstances. For example, in order to shorten the data acquisition time in a time-resolved MR angiography study, undersampled projection reconstruction, or radial, acquisition methods are often intentionally introduced.

The common problem presented in imaging is of estimating a discrete approximation of an image that gave rise to the observed measurements. If $\Phi$ denotes a linear sensing operator, such as the partial discrete Fourier Transform ("DFT") matrix common in magnetic resonance imaging, this estimation problem becomes one of recovering a discrete signal, s, from a corrupted measurement vector:

$$f = \Phi s + n \qquad \text{Eqn. (1);}$$

where n represents the statistics of a noise process and f is the measurement vector. In MRI, the measurement vector is representative of acquired k-space data, whereas in CT, the measurement vector is representative of the acquired x-ray projection data. It is noted that generic a priori knowledge about the signal class, of which the discrete signal, s, is a member, may be considered. It can be assumed that n is drawn from an independent and identically distributed ("i.i.d.") Gaussian processes.

Given Eqn. (1), the maximum likelihood ("ML") estimator of the discrete signal, s, is given by the solution to the ordinary least squares ("OLS") problem:

$$u_{ML} = \arg\min_u \|\Phi u - f\|_2^2 = (\Phi * \Phi)^{-1} \Phi * f; \qquad \text{Eqn. (2)}$$

where u is a desired estimate of the discrete signal, s. Note that the uniqueness of $u_{ML}$ is only guaranteed if $\Phi$ is full rank. In fact, even if $\Phi$ is full rank, it may very well be ill-conditioned. To counter potential ill-posedness, the OLS problem is often stabilized by imposing constraints based on a priori knowledge or assumptions about the discrete signal, s.

Sparsity is a very "powerful" form of a priori knowledge. An image, I, is said to be sparse if, given some "sparsifying" transform, $\Psi$, such as a wavelet or spatial gradient transform, $S \ll |\Omega|$, where $S = \text{supp}(\Psi I)$ and $\Omega = \text{dom}(I)$. Given a limited set of potentially noisy measurements, the search for the sparsest image possessing a prescribed degree of fidelity to the measurement set is defined by the following $l_0$-minimization problem:

$$\min_u \|\Psi u\|_0 \quad s.t. \quad \|\Phi u - f\|_2^2 \le \varepsilon^2; \qquad \text{Eqn. (3)}$$

where $\epsilon^2$ is the variance of the noise, n, and $\|v\|_0$ indicates the $l_0$-norm of a vector, v, which has the form:

$$\|v\|_0 = \sum_{x \in \Omega} 1(|v(x)| > 0). \qquad \text{Eqn. (4)}$$

Thus, the $l_0$-norm of a vector, v, provides a count of the non-zero terms in the vector, v.

It has recently been shown that, for the specific case in Eqn. (3) where the sparsifying transform, $\Psi$, is set to the identity matrix, and $\epsilon = 0$, only $O(S \log(|\Omega|))$ random samples are necessary to guarantee with significant probability that the solution of Eqn. (3) is exactly s. While these sampling conditions are theoretically alluring, Eqn. (3) requisites combinatorial optimization (Eqn. (3) is, technically speaking, NP-complete) and, thus, is of little practical use in modern imaging.

Recently, a new mathematical framework for image reconstruction termed "compressed sensing" ("CS") was formulated. In compressed sensing, only a small set of linear projections of a sparse image are required to reconstruct a quality image. The theory of CS is described by E. Candès, J. Romberg, and T. Tao, in "Robust uncertainty principles: Exact Signal Reconstruction from Highly Incomplete Frequency Information," IEEE Transactions on Information Theory 2006; 52:489-509, and by D. Donoho in "Compressed Sensing," *IEEE Transactions on Information Theory* 2006; 52:1289-1306, and is disclosed, for example, in U.S. Pat. No. 7,646,924.

Consider the following generalization of Eqn. (3):

$$\min_u P(\Psi u) \quad s.t. \quad \|\Phi u - f\|_2^2 \le \varepsilon^2; \qquad \text{Eqn. (5)}$$

where P( . . . ) is a separable metric prior functional. The work of Candès, et al., and Donoho produced both exact and approximate recovery sampling conditions for $P(v)=\|v\|_1$, a convex functional, similar to those associated with Eqn. (3), albeit with a higher sampling constant. This area of study is now generally known as compressed, or compressive, sensing.

In aspiration of reducing sampling requirements closer to the $l_0$-associated theoretical limit, quasi-convex, almost everywhere ("a.e.") differentiable prior functionals, such as $P(v)=\|v\|_p^p$ with $0<p\le 1$ have been investigated recently. Such prior functionals more closely resemble the target $l_0$-norm than does $l_1$; however, while these methods have the potential to outperform analogous convex techniques, in practice, they cannot guarantee numerical achievement of global minima since they are non-convex in nature.

The field of medical imaging can benefit from compressed sensing. In x-ray computed tomography ("CT"), fewer measurements translates to a lower radiation dose received by the patient. Similarly, in magnetic resonance imaging ("MRI"), decreasing the required number of measurements necessary to form an image allows for faster exams, which improves patient comfort and thereby minimizes the likelihood of subject motion. Additionally, clinical throughput is increased which potentially translates to reduced patient costs.

Since its inception, substantial effort has been made to decrease the required scan time in MRI. Early techniques, such as echo-planar imaging ("EPI"), traverse the entirety of k-space during a single repetition time ("TR") period, thereby offering a dramatic increase in speed, albeit at the expense of demanding hardware performance and significantly lowered signal-to-noise ("SNR") levels.

Alternatively, if the signal of interest is assumed to be strictly real, Hermitian symmetry of k-space can be exploited such that it is only necessary to perform measurements over half of the spectral grid in k-space. In practice, however, the strict reality assumption is violated due to magnetic field inhomogeneities; chemical shift and magnetic susceptibility effects; as well as artifacts from physiological motion and flow dynamics. As a result of these effects, phase errors must be corrected prior to making the Hermitian assumption. If image phase is assumed to be smoothly varying over space, the standard approach to phase correction involves measuring a symmetric low-frequency band of k-space and estimating the image space phase solely from this restricted measurement set. The solution magnitude is then derived from a moderately undersampled subset of k-space which also includes the small support used in the phase estimation step. A complex image is then formed by conjoining the image magnitude and phase estimates, with only the real portion of this generated image being retained as the solution. Due to the necessity of acquiring a symmetric, low-frequency spectral band for use in the phase estimation process, methods which rely on Hermitian symmetry such as projections onto convex sets ("POCS") and homodyne detection can only decrease the number of required measurements by less than half of that delimited by Shannon's theorem.

In both MR and CT imaging, any reduction in scan time offers potential benefits including high temporal resolution for observing physiologic processes, reduction of motion artifacts, lower radiation dose (for CT), and improved patient comfort and throughput. With the advent of compressive sensing techniques, certain classes of images can be accurately reconstructed from highly undersampled, and thus quickly acquired, data by solving a convex $l_1$-minimization problem. For example, following the recent development of compressed sensing, it was shown that clinical MR images possessing a sparse representation in some transform domain can be accurately reconstructed, even when sampled at rates well below the Nyquist limit. This accurate reconstruction was achieved by casting the image reconstruction as a convex $l_1$-minimization problem. While $l_1$-based techniques offer an advantage over Nyquist-limited methods, they nonetheless require a significant degree of oversampling above the theoretical minimum sampling rate allowed by compressed sensing in order to guarantee the achievability of exact reconstruction. In addition, such techniques are computationally intensive.

It would therefore be desirable to provide a method for image reconstruction, in which a greater degree of undersampling than achievable with current $l_1$-based reconstruction techniques is employed without resulting in a decrease in overall image quality.

SUMMARY OF THE INVENTION

The present invention overcomes the aforementioned drawbacks by providing a generalization of compressed sensing that allows undersampling closer to the theoretical minimum achievable with compressed sensing. A homotopic approximation of concave metric prior functionals to an $l_0$-norm is utilized in an iterative minimization.

The method is applicable to any number of different medical imaging modalities, such as magnetic resonance imaging ("MRI") and x-ray computed tomography ("CT") imaging. Such a method allows for an increase in temporal resolution and a decrease in scan time in both MRI and CT imaging, as well as a decrease in radiation dose in CT imaging.

It is an aspect of the invention to provide a method for image reconstruction from highly undersampled image data, in which a concave metric prior that is homotopic with an $l_0$-norm is iteratively minimized. The concave metric prior includes a scale parameter, $\sigma$, that is reduced towards zero during each iteration. During each iteration, the reduction of the scale parameter results in a continuous deformation of the concave metric prior towards the $l_0$-norm. In this manner, an image can be reconstructed from substantially fewer samples that required by the Nyquist criterion. For example, a clinically acceptable image can be reconstructed from as few as around 4 percent of the number of samples required by the Nyquist criterion.

It is another aspect of the present invention to provide a method for efficiently reconstructing three-dimensional images from three-dimensional image data. Such a method provides image reconstruction based on homotopic approximation of the so-called $l_0$-norm. In using this implementation, images are reconstructed from undersampled image data acquired at sampling rates even lower than those achievable with $l_1$-minimization.

It is yet another aspect of the invention to provide a method for reconstructing three-dimensional images from image data acquired with contrast enhanced magnetic resonance angiography. Such image data may be acquired with parallel imaging techniques. In this manner, high quality, non-view-shared, three-dimensional images of the contrast-filled vasculature can be produced at acceleration factors exceeding the number of radio frequency ("RF") receiver coils.

The foregoing and other aspects and advantages of the invention will appear from the following description. In the description, reference is made to the accompanying drawings which form a part hereof, and in which there is shown by way of illustration at least one embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
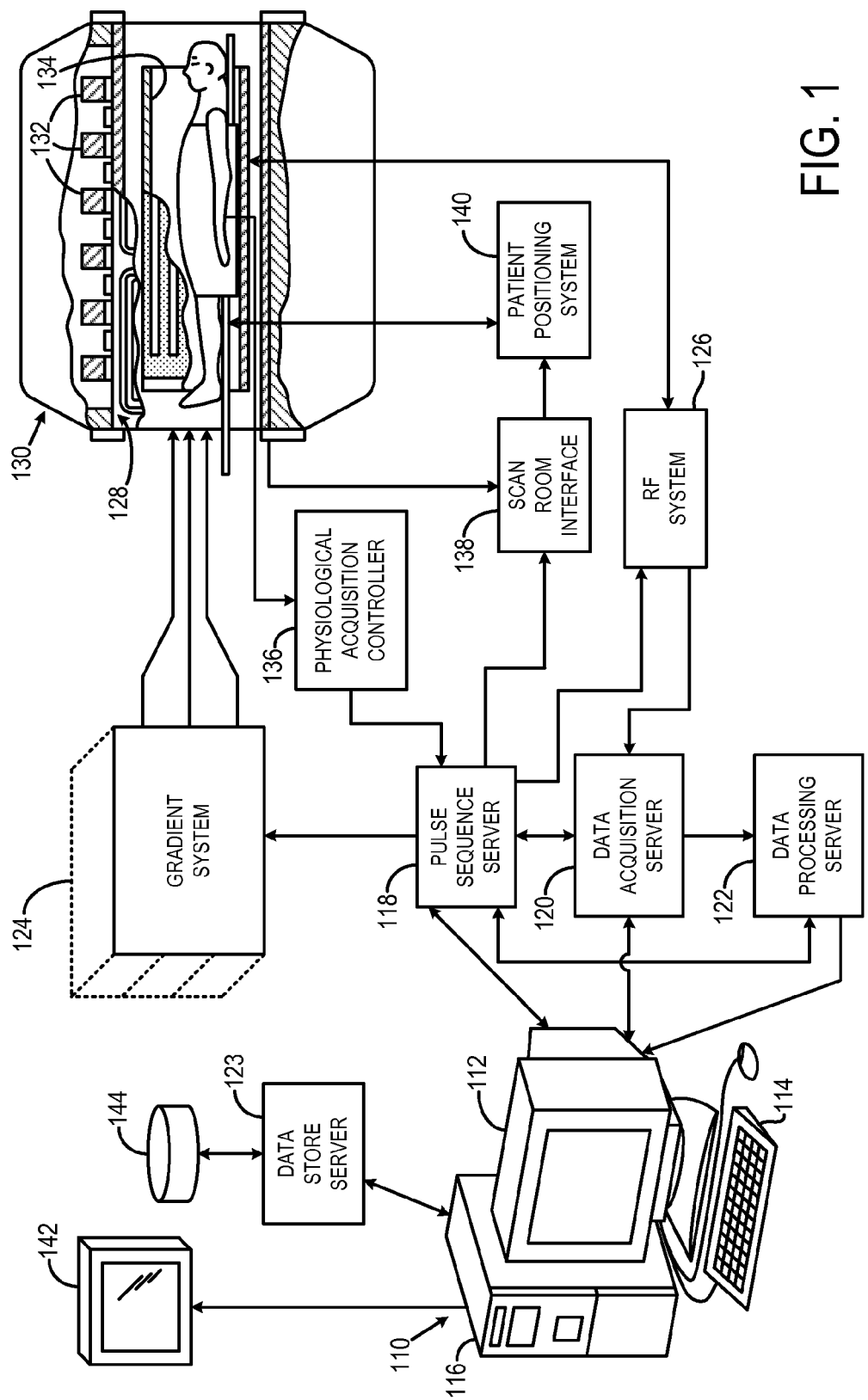
FIG. 1 is a block diagram of an exemplary magnetic resonance imaging ("MRI") system that employs the present invention.

Described herein is a method for image reconstruction that utilizes concave metric prior functionals in a compressed sensing-based reconstruction. Such a reconstruction method allows the acquisition of image data with a degree of undersampling significantly lower than those achievable with current $l_1$-based compressed sensing methods. In turn, this increase in achievable undersampling allows a significant increase in temporal resolution in the imaging process, or alternatively, a significant decrease in scan time.

Compressed Sensing

As discussed above, $l_0$-based problem formulations are theoretically optimal, but of limited practical use because they are computationally impractical. In standard CS, the challenging $l_0$-norm term is relaxed to either a convex or a quasi-convex form, as demonstrated above in Eqns. (3) and (5).

In most medical imaging applications, including MRI, signals are rarely noise-free and it is desirable to investigate how measurement error affects the stability of the image reconstruction method. Suppose that the measured data is given by $f_n = f + n$, where n is a noise process such as additive white Gaussian noise ("AWGN") found on each of the quadrature measurement channels in MRI. Addressing the potential for measurement error, the compressed sensing minimization problem can be reformulated as $$\min_u \|\Psi u\|_1; \quad \text{Eqn. (6)}$$

such that, $$\|\Phi u - \Phi f_n\|_2^2 \leq \varepsilon; \quad \text{Eqn. (7)}$$

where, $\varepsilon$, is a statistic describing the magnitude of the error. For AWGN processes observed in $l_2$, $\varepsilon$ is generally taken as the noise variance. Alternatively, $\varepsilon$ may be subjectively defined as the maximum allowable error in the generated approximation. Again referring to the exemplary case where the sparsifying transform, $\Psi$, is the identity matrix, I, the solution to Eqn. (6) will exhibit approximate error on the order of $\|u - f\|_2 \leq C \cdot \varepsilon$, where the multiplicative constant C depends on the restricted isometry constant. For a fixed measurement matrix, $\Phi$, the accuracy of approximation for a signal reconstruction by $l_1$-minimization thus degrades gracefully in the presence of increasing levels of noise and the reconstruction process is both robust and stable.

Most medical images do not possess truly sparse representations in any domain, as nearly all of their related transform coefficients are of nonzero value. Fortunately, many images are compressible in the sense that image information is strongly captured by a small subset of these coefficients. For example, the dominating morphological features of many anatomical MR images, such as angiograms, can be closely approximated by sparse models generated with transforms promoting piecewise smoothness. For example, bounded variational models and many types of wavelets can be utilized as approximate sparse models. For the case where $\Psi = I$, let $f_S$ denote the signal constructed from only the S-largest coefficients of f. It has been shown that when a dense signal is reconstructed according to the compressed sensing framework, the approximation error will be bounded as $$\|u - f\|_1 \leq C \cdot \|f - f_S\|_1 \quad \text{Eqn. (8);}$$

where the multiplicative constant C is again dependent on the restricted isometry constant. Consequently, for a compressive signal, most of the information will nonetheless be captured during the measurement process and the approximation will be on par with the best possible S-term approximation given full a priori specification of the signal, as described by E. Candès, J. Romberg, and T. Tao in "Stable Signal Recovery from Incomplete and Inaccurate Measurements," Communications on Pure and Applied Mathematics, 59(8):1207-1223, 2006.

Extension of Compressed Sensing to $l_p$ ($0 < p \leq 1$)

In general, fewer measurements are necessary to exactly reconstruct a given signal via $l_0$-minimization than by $l_1$-minimization. A direct solution of the $l_0$-minimization problem is given by:

$$\min_u \|\Psi u\|_0, \quad \text{such that } \Phi u = \Phi f. \quad \text{Eqn. (9)}$$

While a direct solution of the $l_0$-minimization problem given by Eqn. (9) is infeasible for most practical applications, it is natural to ask whether there exists an alternative prior, or class of priors, that admit better sampling bounds than the $l_1$-norm, and are computationally feasible. The $l_0$ quasi-norm is commonly defined as:

$$\|v\|_0 = \lim_{p \to 0} \sum_{x \in \Omega} |v(x)|^p. \quad \text{Eqn. (10)}$$

It has been suggested to use the $l_p$ semi-norm ($0 < p \leq 1$) class of sparsity priors within a basis pursuit reconstruction framework and showed asymptotic convergence of the $l_p$ sampling bounds towards using reconstruction in parallel ("RIP"), as described, for example, by R. Chartrand in "Exact Reconstructions of Sparse Signals via Nonconvex Minimization," *IEEE Signal Process. Lett.*, 14:707-710, 2007. Although the practical use of semi-norm priors for the numerical achievement of the global minimum is not guaranteed as a consequence of their non-convexity, these functionals admit a nonzero gradient almost everywhere. Thus, at least local minima, many of which are more than sufficient in practice, can be found via standard descent methods as opposed to combinatorial search.

The benefits of extending the compressed sensing problem to an $l_p$ recovery problem can be described as follows. Consider, for example, the $l_p$ recovery problem:

$$\min_u \|\Psi u\|_p^p, \quad \text{such that } \Phi u = \Phi f; \quad \text{Eqn. (11)}$$

where ($0 < p \leq 1$). For $\Psi = I$, a sufficient condition for exact recovery of a signal of cardinality S via Eqn. (11) is given by:

$$\delta_{2M} < \left[ 1 + \sqrt{\frac{2M}{S}} \cdot \left(\frac{S}{M}\right) \right]^{-1}; \quad \text{Eqn. (12)}$$

for any $M \geq S$. Next, suppose $\Phi$ is an $N \times |\Omega|$ matrix containing randomly selected rows (uniform probability) of the discrete Fourier transform ("DFT") matrix defined on $\Omega$; by definition, N denotes the number of measurements performed by applying Φ to a signal. For any γ>0, it has been shown that if:

$$N \geq C\left(\frac{2M\log|\Omega|}{\gamma^2}\right)\log\left(\frac{2M\log|\Omega|}{\gamma^2}\right)\log^2(2M); \quad \text{Eqn. (13)}$$

then for some absolute constant C:

$$E\delta_{2M} \leq \gamma \quad \text{Eqn. (14)};$$

with high probability, where E denotes the expected value operator. When γ is equated to the right side of Eqn. (12), it follows that decreasing p implies an analogous decrease in the required number of measurements, N, needed to achieve exact reconstruction. As anticipated, the use of diminishing values of p allows a signal to be exactly reconstructed from fewer and fewer measurements. Thus, if the compressed sensing framework can be extended to an $l_p$ recovery problem, then fewer data measurements will be required, thereby allowing for increases in temporal resolution and decreases in overall imaging time.

The calculation given in Eqn. (12) provides an exact characterization of the performance of reconstructions employing the $l_p$ semi-norms (0<p≤1), but the results are not at all surprising—utilizing approximations that are closer to the $l_0$ quasi-norm than $l_1$ correspondingly lower the required number of measurements necessary to accurately reconstruct a signal. When considering p to be a static variable, an open problem exists on how to assign this variable. While relatively smaller values of p offer the potential for reconstruction of a signal from fewer measurements, this gain comes at the cost of increasing numerical stiffness.

Reconsider the limit definition of the $l_0$ quasi-norm given in Eqn. (10). While the $l_p$ functional is a desirable choice for defining $l_0$ as a sequence limit, there exist many possible functionals, generically denoted by ρ, that satisfy:

$$\lim_{\sigma \to 0} \sum_{\Omega} \rho(|u|, \sigma) = \sum_{\Omega} 1(|u| > 0); \quad \text{Eqn. (15)}$$

where σ represents a sequence index, or "scale parameter." As will be discussed, only a small subclass of such functionals can be practically employed for the sparse reconstruction problem.

A key motivation for employing the $l_p$ limit sequence given in Eqn. (10) is that every sequence element can be independently and successfully used as a prior for the sparse reconstruction problem and still yield a unique and exact solution. Consequently, there is a sense of stability for the entire solution path, not only at the sequence limit, σ=0. Consider the general class of semi-metric functionals, that is, positive-definite and zero-symmetric, that are non-decreasing over $\mathbb{R}^+$. These functionals provide a measure of deviation of the function of interest from zero, and as σ→0, by definition, they provide a progressively refined measure of signal sparsity that approaches that yielded by the $l_0$ quasi-norm.

In the event that ρ is strictly concave over $\mathbb{R}^1$, the functional is inherently subadditive and, thus, a true metric. It can then be shown that, for any fixed value of σ, a unique and exact solution to the sparse reconstruction is possible. For example, it can be shown that many robust error norms and other redescending M-estimators such as the Laplace function:

$$\rho(|u|, \sigma) = 1 - e^{-\frac{|u|}{\sigma}}; \quad \text{Eqn. (16)}$$

the Geman-McClure function:

$$\rho(|u|, \sigma) = \frac{|u|}{|u| + \sigma}; \quad \text{Eqn. (17)}$$

the concave logarithmic penalty:

$$\rho(|u|, \sigma) = \ln\left(\frac{|u|}{\sigma} + 1\right); \quad \text{Eqn. (18)}$$

the Gauss error function:

$$\rho(u, \sigma) = 1 - e^{\frac{u^2}{2\sigma^2}}; \quad \text{Eqn. (19)}$$

and the Tukey biweight error function:

$$\rho(u, \sigma) = \begin{cases} \frac{3u^2}{\sigma^2} - \frac{3u^4}{\sigma^4} + \frac{u^6}{\sigma^6}, & |u| \leq \sigma \\ 1, & |u| > \sigma \end{cases}; \quad \text{Eqn. (20)}$$

all yield exact signal reconstructions for any σ∈[0,∞). In fact, if a signal can be exactly recovered by $l_1$-minimization, it is also recoverable via any ρ that is non-decreasing and concave over $\mathbb{R}^+$. Furthermore, for the above examples as well as many others, if ρ is scaled by a constant factor such that ρ(1,σ)=1, σ→∞ admits ρ(|u|,σ)→|u|. In other words, ρ interpolates the function space between $l_1$ and $l_0$ across σ∈[0,∞) in the same manner as does $l_p$ for p∈[0,1].

As anticipated, and as will be discussed below, when σ is progressed towards zero, signals are observed to be recoverable from many fewer samples than via $l_1$-based approaches when using priors such as those in Eqns. (16)-(20).

Given a sufficient sampling rate (for example, 18 or more Fourier projections), the results obtained by $l_1$-minimization and homotopic $l_0$ minimization are substantially identical and both are exact. However, as the sampling rate is further reduced the $l_1$-based reconstruction quickly begins to degrade whereas the $l_0$ homotopic reconstruction continues to be exact all the way down to, for example, only 10 Fourier projections.

Homotopic $l_0$-Minimization

In the herein described method, the computationally-challenging problem of $l_0$-minimization is addressed by a procedure known as "homotopy," or continuation. Under this scheme, a related but simplified problem is first solved and its solution is used as the warm-start initializer for a slightly harder problem that is closer to the target. This process is then repeated until the target problem is reached or the solution becomes stationary. While the optimality of this paradigm is not, in general, theoretically guaranteed, the observed practical gain is often substantial. In many cases, the solution to the simple problem lies relatively close in the function space to the solution of the hard problem. As the algorithm progresses, this extrema point is then tracked to the solution of the hard problem, avoiding many of the local extrema that would be encountered if the hard problem was attacked directly. If the exact solution of the hard problem is not achieved, the found local minimum is often far more satisfactory than that found without the continuation process.

As will be described below, continuation of deformable concave metrics towards the $l_0$ quasi-norm for undersampled MRI reconstruction within the CS setting is utilized for image recovery. As referred to herein, and as described above, the term "concave metric" refers to those functions that are symmetric, positive-definite, and subadditive. It is noted that a function that is subadditive adheres to the following:

$$\forall x,y \in A, f(x+y) \leq f(x)+f(y) \qquad \text{Eqn. (21)}.$$

That is to say, the value of a subadditive function for the sum of two elements (say, x+y) always returns a value less than or equal to the sum of the separate values of the function at the two respective elements.

For any particular concave metric, $\rho$, satisfying Eqn. (15), consider the sequence of problems given by $$u^{t+1} = \operatorname*{argmin}_{u^t} \sum_\Omega \rho(|u^t|, \sigma^t), \text{ such that } \|\Phi u^t - \Phi f\|_2^2 \leq \varepsilon; \qquad \text{Eqn. (22)}$$

where $\sigma^{t+1} < \sigma^t$. This process is herein referred to as "homotopic $l_0$-minimization," since the subproblems asymptotically approach the $l_0$-minimization problem as $t \to \infty$ and $\sigma^t \to 0$. Practically, the solution to the $t^{th}$ subproblem is used as the initial estimate of the solution to $(t+1)^{th}$ subproblem. An efficient, semi-implicit numerical solver for Eqn. (22) will be described below in detail, and practical assignment of $(\sigma^{t+1}/\sigma^t)$ will also be discussed.

When $\sigma > 0$, $\rho$ is continuous and possesses a nonzero gradient on at least some subset of $\mathbb{R}$ and thus admits a weak Euler-Lagrange equation for which extrema can be readily computed using standard descent methods. It has also been shown in the previous sections that there exist conditions on $\Phi$, such that each subproblem of Eqn. (22) is independently capable of sparse signal reconstruction and, thus, viable reconstructions are possible even under early termination of the sequence. For example, for the case where the $l_p$-norm is selected as the prior functional, the required number of samples is effectively stationary for p<0.1. Consequently, it may occur that, as p is progressively reduced, the generated solution does not change under further reduction of p.

A desirable functional prior, $\rho$, is chosen to satisfy the concavity and metric conditions previously described. With such a choice, Eqn. (22) is invariant to the particular functional specification since all choices will asymptotically tend towards the $l_0$ quasi-norm.

Exemplary Implementation of Homotopic $l_0$ Minimization

In many instances in optimization theory, constrained problems are converted to an analogous unconstrained form prior to analysis in order to allow the use of more general and intuitive numerical solvers, such as descent-based methods. By way of example, this approach is employed to address the iterative reconstruction problem described in Eqn. (22). Consider the energy functional given by:

$$E(u, \sigma, \lambda) = \sum_\Omega \rho(|\Psi u|, \sigma) + \frac{\lambda}{2} \|\Phi u - \Phi f\|_2^2; \qquad \text{Eqn. (23)}$$

where $\lambda$ is a parameter that controls the tradeoff between solution sparsity and data fidelity. For each subproblem of Eqn. (22), an analogous unconstrained problem is given by:

$$v = \operatorname*{argmin}_{u} E(u, \sigma, \lambda). \qquad \text{Eqn. (24)}$$

When the prior functional, $\rho$, is convex, the Kuhn-Tucker theorem asserts that there exists a parameter $\lambda \geq 0$ such that minimizers of Eqn. (23) and its constrained analog are equivalent. Similarly, for the non-convex case, $\lambda$ can be chosen such that the so-called duality gap between the two problems is minimized and the solutions will be arbitrarily close to one another. In general, analytic determination of $\lambda$ as a function of $\epsilon$ is quite challenging and this parameter is often either assigned manually or determined iteratively using estimation techniques such as cross validation. Exemplary values of $\lambda$ include $\lambda \epsilon (1 \times 10^{-3}, 1 \times 10^6)$.

Given the functional definition in Eqn. (23), minima of the energy functional, E, are yielded as solutions of the associated Euler-Lagrange equation:

$$L(u,\sigma,\lambda) = \Psi^* \Lambda(u) \Psi u + \lambda \Phi^*(\Phi u - \Phi f) = 0 \qquad \text{Eqn. (25)};$$

where the diagonal matrix, $\Lambda(u)$, is defined as:

$$\Lambda(u)_{x,x} = \frac{\rho'(|\Psi u(x)|, \sigma)}{|\Psi u(x)|}. \qquad \text{Eqn. (26)}$$

As the concave prior, $\rho$, is, by construction, continuous but non-differentiable at the origin, the derivative, $\rho'$, is taken in the weak sense. For example, a weak derivative of:

$$\rho(|u|) = |u| \qquad \text{Eqn. (27)};$$

is given by the signum function, $$\rho'(|u|) = sgn(u) \qquad \text{Eqn. (28)}.$$

In practice, a small constant, $\epsilon$, is often added to the denominator of Eqn. (26) for increased numerical stability. When the sparsifying operator, $\Psi$, is a scalar transformation, for example, a wavelet, its application within $\Lambda$ is straightforward. For vectorial cases, such as the two-dimensional discretized gradient operator given by:

$$\Psi = \begin{bmatrix} D_x \\ D_y \end{bmatrix}; \qquad \text{Eqn. (29)}$$

$\Psi$ will transform u from $\Omega \times 1$ to $C \cdot \Omega \times 1$, where C is the dimensionality of the vector transform. For the example in Eqn. (29), C=2. Consequently, $\Lambda(u)$ must be $C \cdot \Omega \times C \cdot \Omega$. To rectify this discrepancy, $\Lambda(u)$ can be generalized as:

$$\Lambda(u) \to I_C \otimes \Lambda(u) \qquad \text{Eqn. (30)};$$

where $I_C$ is a C×C identity matrix and the operator, "$\otimes$", is the Kronecker product.

Consolidation of the target variable, u, yields:

$$[\Psi^* \Lambda(u) \Psi + \lambda \Phi^* \Phi] u = \lambda \Phi^* \Phi f \qquad \text{Eqn. (31)}.$$

Additionally, let $$B(u) = \Psi^* \Lambda(u) \Psi + \lambda \Phi^* \Phi \qquad \text{Eqn. (32)};$$

denote the Hessian approximate. Following the so-called "lagged diffusivity" approach for total variation ("TV") minimization, which is itself a special case of the half-quadratic regularization, Eqn. (31) can be cast into fixed-point form and iterated as:

$$u^{t+1}=B^{-1}(u^t)\lambda\Phi^*\Phi f \quad \text{Eqn. (33)}.$$

Moreover, when $\lambda\Phi f$ is defined by the recursion:

$$\lambda\Phi^*\Phi f=B(u^t)u^t-L(u^t,\sigma,\lambda) \quad \text{Eqn. (34);}$$

a robust quasi-Newton iteration, $$u^{t+1}=u^t+\Delta^t \quad \text{Eqn. (35);}$$

is obtained for the computation of u, where, $$B(u^t)\Delta^t=-L(u^t,\sigma,\lambda) \quad \text{Eqn. (36).}$$

In such an embodiment, the inversion of the Hessian approximate implicit to Eqn. (36) is performed via a conjugate gradient ("CG") iteration.

As discussed previously, reconstruction of images from undersampled image data requires the analysis of complex data. Fortunately, such a generalization of the described fixed-point solver is straightforward. Following the previous discussion, a complex generalization of the unconstrained energy functional in Eqn. (23) is given by:

$$E(u,\sigma,\lambda)=\sum_{\Omega}[\rho(|\Psi\mathcal{R}u|,\sigma)+\rho(|\Psi\mathcal{I}u|,\sigma)]+\frac{\lambda}{2}\|\Phi u-\Phi f\|_2^2; \quad \text{Eqn. (37)}$$

where R and I denote the real and imaginary operators, respectively.

Differentiation of $E(u,\sigma,\lambda)$ with respect to u then yields the Cauchy-Riemann system:

$$\begin{bmatrix} B(\mathcal{R}u)\mathcal{R} & i\lambda\Phi*\Phi \\ \lambda\Phi*\Phi & iB(\mathcal{I}u)\mathcal{I} \end{bmatrix}\begin{bmatrix} u \\ u \end{bmatrix}=\lambda\begin{bmatrix} \Phi*\Phi f \\ \Phi*\Phi f \end{bmatrix}; \quad \text{Eqn. (38)}$$

however, as this system is overdetermined, the least-squares approximate of the solution is computed. Denoting the complex Hessian approximate as:

$$C(u)=B(Ru)R+iB(Iu)I+\lambda\Phi^*\Phi \quad \text{Eqn. (39);}$$

and $$\tilde{L}(u,\sigma,\lambda)=B(Ru)Ru+iB(Iu)Iu+\lambda\Phi^*\Phi u-2\lambda\Phi^*\Phi f \quad \text{Eqn. (40)}$$

a quasi-Newton iteration for the complex homotopic $l_0$-minimization problem is given by $$u^{t+1}=u^t+\Delta^t \quad \text{Eqn. (41);}$$

where $$C(u^t)\Delta^t=-\tilde{L}(u^t,\sigma,\lambda) \quad \text{Eqn. (42).}$$

The iterative equation given in Eqn. (41) serves as the update step in the continuation algorithm that is described below. In particular, Eqn. (41) is solved once per inner iteration of the homotopy continuation scheme, which is described in Eqn. (22). Prior to describing a practical implementation of the exemplary method set forth in this section, a brief discussion of exemplary medical imaging systems is provided.

Magnetic Resonance Imaging System

Referring particularly to FIG. 1, the preferred embodiment of the invention is employed in a magnetic resonance imaging ("MRI") system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radiofrequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \quad \text{Eqn. (43);}$$

and the phase of the received MR signal may also be determined:

$$\phi=\tan^{-1}\left(\frac{Q}{I}\right). \quad \text{Eqn. (44)}$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate," the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; and the calculation of motion or flow images.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

The present invention is also particularly applicable to other medical imaging modalities. One such imaging modality is x-ray computed tomography.

X-Ray Computed Tomography Imaging System

Figure 2A:
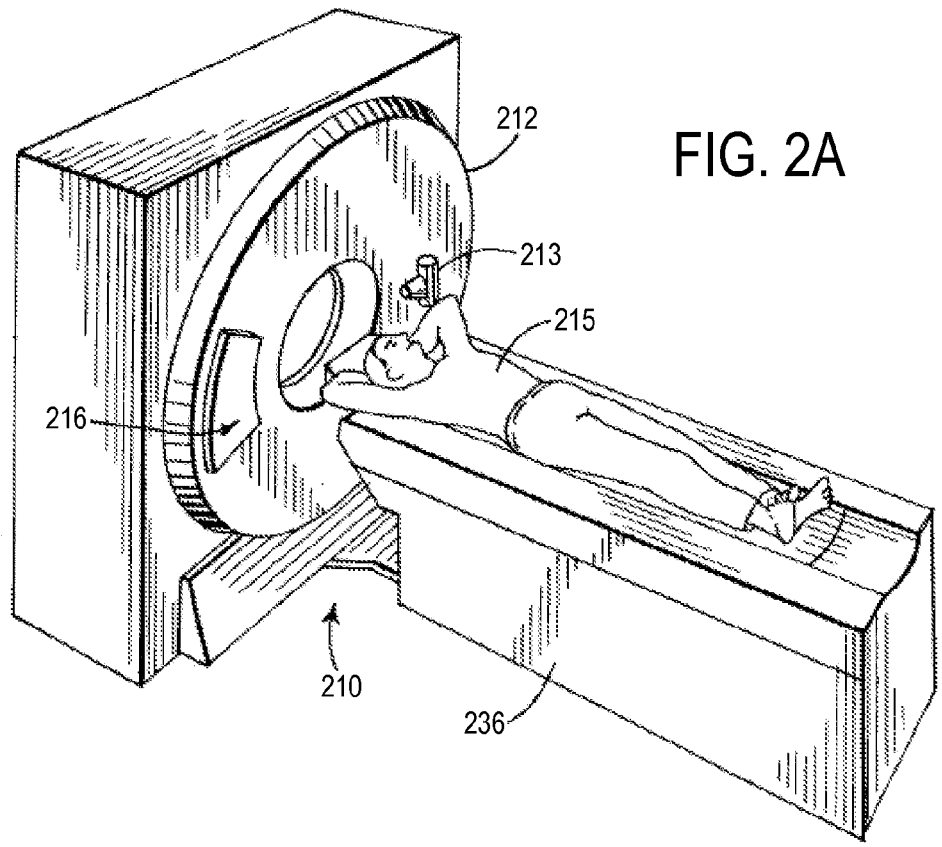
FIG. 2A is a pictorial view of an exemplary x-ray computed tomography ("CT") imaging system.
Figure 2B:
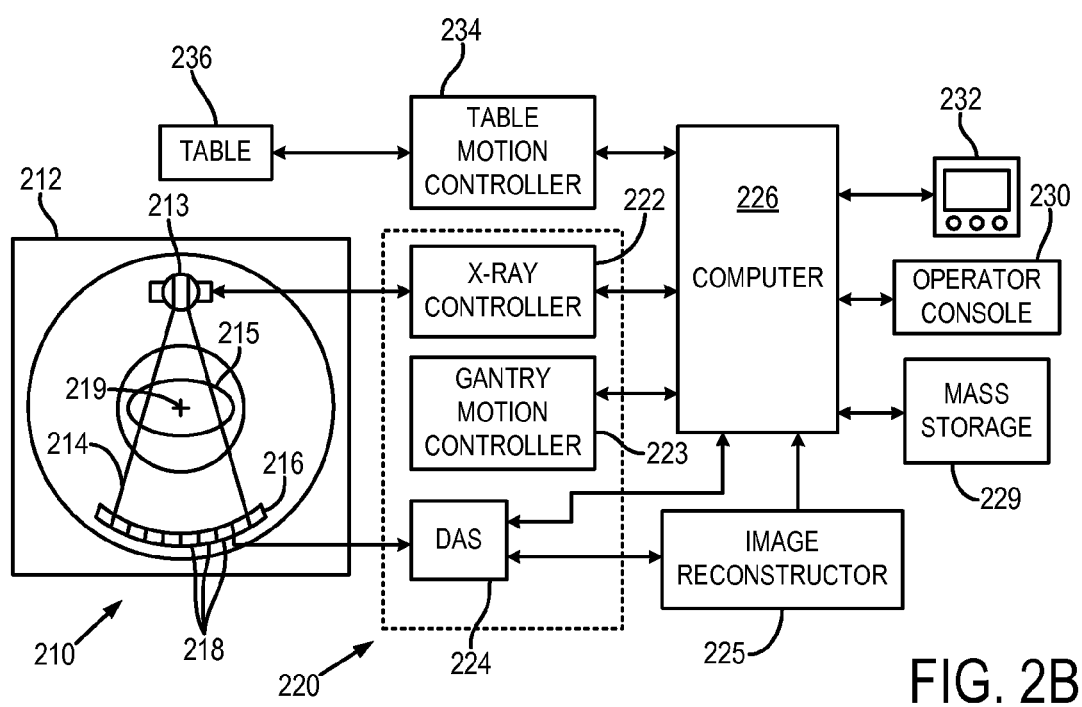
FIG. 2B is a block diagram of the CT imaging system of FIG. 2A.

With initial reference to FIGS. 2A and 2B, an x-ray computed tomography ("CT") imaging system 210 includes a gantry 212 representative of a "third generation" CT scanner. Gantry 212 has an x-ray source 213 that projects a fan-beam, or cone-beam, of x-rays 214 toward a detector array 216 on the opposite side of the gantry. The detector array 216 is formed by a number of detector elements 218 which together sense the projected x-rays that pass through a medical patient 215. Each detector element 218 produces an electrical signal that represents the intensity of an impinging x-ray beam and hence the attenuation of the beam as it passes through the patient. During a scan to acquire x-ray projection data, the gantry 212 and the components mounted thereon rotate about a center of rotation 219 located within the patient 215.

The rotation of the gantry and the operation of the x-ray source 213 are governed by a control mechanism 220 of the CT system. The control mechanism 220 includes an x-ray controller 222 that provides power and timing signals to the x-ray source 213 and a gantry motor controller 223 that controls the rotational speed and position of the gantry 212. A data acquisition system ("DAS") 224 in the control mechanism 220 samples analog data from detector elements 218 and converts the data to digital signals for subsequent processing. An image reconstructor 225, receives sampled and digitized x-ray data from the DAS 224 and performs high speed image reconstruction. The reconstructed image is applied as an input to a computer 226 which stores the image in a mass storage device 228.

The computer 226 also receives commands and scanning parameters from an operator via console 230 that has a keyboard. An associated display 232 allows the operator to observe the reconstructed image and other data from the computer 226. The operator supplied commands and parameters are used by the computer 226 to provide control signals and information to the DAS 224, the x-ray controller 222 and the gantry motor controller 223. In addition, computer 226 operates a table motor controller 234 which controls a motorized table 236 to position the patient 215 in the gantry 212.

Like the MRI system, the CT system has many different clinical applications in which either two- or three-dimensional sets of projection views are acquired and used to reconstruct one or more images of the patient. Whereas the projection views acquired by the MRI system are composed of k-space samples, the projection views acquired by the CT system are composed of x-ray projection space samples. Image reconstruction using data acquired with a CT system necessarily requires transformation from x-ray projection space to real space.

Exemplary Image Reconstruction Method

Figure 3:
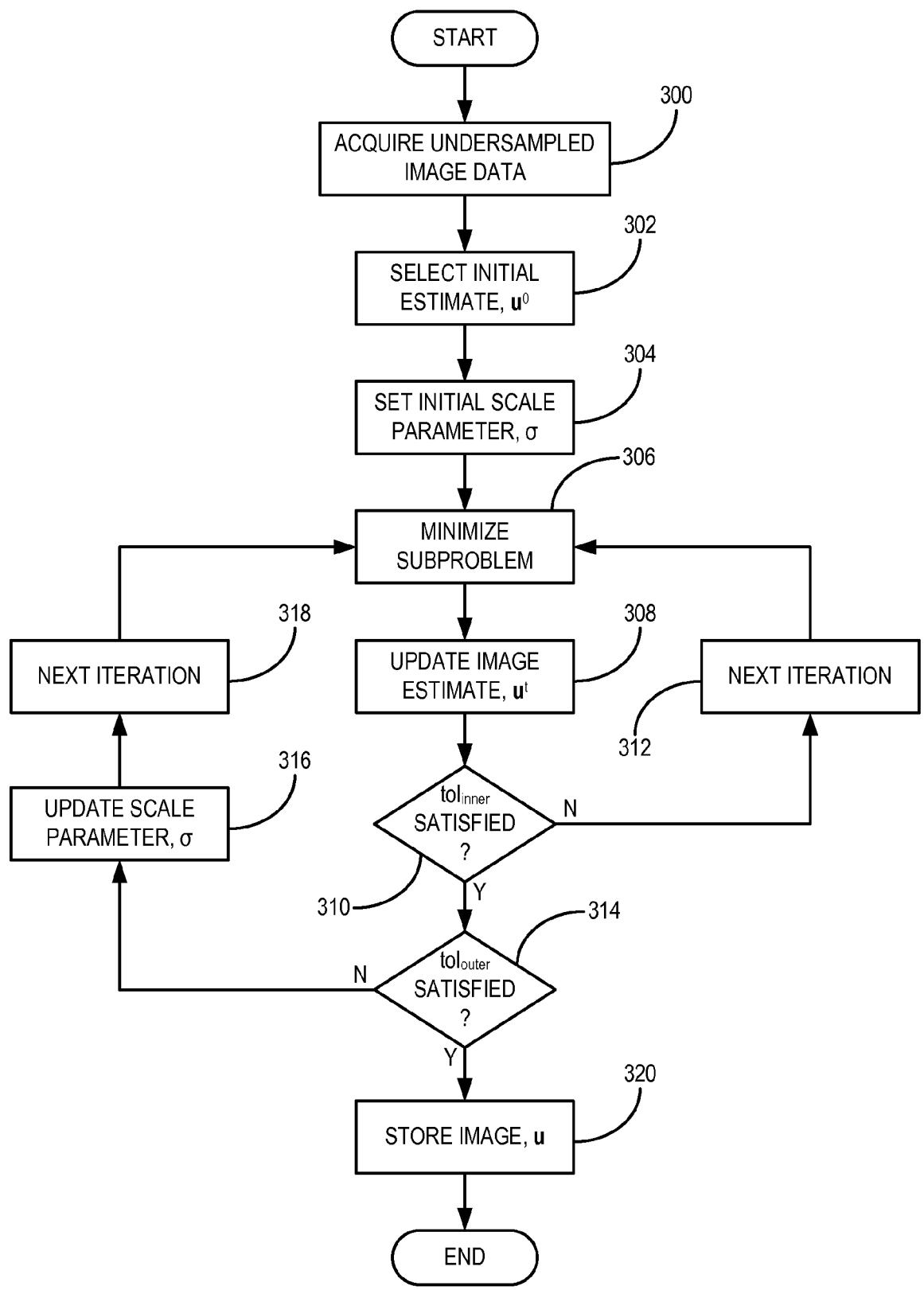
FIG. 3 is a flowchart setting forth the steps of an exemplary method for image reconstruction using iterative homotopic $l_0$ minimization in accordance with the present invention.

Referring now to FIG. 3, a flowchart setting forth the steps of an exemplary image reconstruction method in accordance with the present invention is illustrated. The method begins with the acquisition of undersampled image data from the subject, as indicated at step 300. It is noted again that image data can be acquired with significant undersampling and, yet, clinically acceptable images can still be reconstructed in accordance with the present invention. Exemplary degrees of undersampling achievable with the present invention approach about 4 percent of the Nyquist criterion, that is, about 96 percent undersampling. Image data can be acquired in any number of suitable ways. For example, when using an MRI system, image data can be acquired by directing the MRI to perform a pulse sequence that samples k-space in a Cartesian, radial, or spiral, or other fashion. By way of example, when acquiring image data as a series of radial projections in k-space, it is contemplated that a clinically acceptable image can be reconstructed from only around ten radial projections.

Following the acquisition of image data, the reconstruction method is initialized. First, an initial image estimate is selected, as indicated at step 302. The initial image estimate, $u^0$, can be selected as any number of different image matrices. For example, the initial image estimate can be an image reconstructed with a conventional reconstruction method. While an image reconstructed from significantly undersampled image data such as this would be plagued with image artifacts, it is still amenable to serve as an initial estimate for the final image. Next, an initial scale parameter, σ, is set, as indicated at step 304. An exemplary initial value for the scale parameter, σ, includes any such value significantly larger than zero. For example, the initial scale parameter, σ, can be set as:

$$\sigma = 2 \cdot \max(|u^0|)$$
Eqn. (45).

As the scale parameter, σ, is roughly proportional to the width of the zero well of the sparsity prior, for unity-scaled images a scale parameter σ≫1 is typically employed. However, if an $l_p$-norm prior functional is employed, the scale parameter, σ, is initially set to unity. It will be appreciated by those skilled in the art that many other choices of initial scale parameter are possible depending on the application at task, and on considerations of speed of convergence and other computational considerations. After the initial image estimate, $u^0$, and initial scale parameter, σ, have been set, an iterative homotopic minimization is performed in accordance with the present invention.

In general, the iterative minimization includes an inner loop and an outer loop. The inner loop includes an iterative minimization of a series of subproblems defined by, for example, Eqn. (22), for a given scale parameter, σ. The outer loop includes an iterative reduction in the value of the scale parameter, which is then supplied to the iterative minimization of the inner loop.

Thus, the iterative homotopic $l_0$ minimization proceeds by first minimizing the subproblem, such as the subproblem in Eqn. (22), as indicated at step 306. This step includes the selection of the appropriate subproblem to be solved. That is, a selection of the desired concave metric prior functional, ρ, is made. In the first iteration, the subproblem has the form:

$$u^1 = \underset{u^0}{\operatorname{argmin}} \sum_{\Omega} \rho(|u^0|, \sigma), \text{ such that } \|\Phi u^0 - \Phi f\|_2^2 \le \varepsilon; \quad \text{Eqn. (46)}$$

where $u^1$ is the solution to the subproblem addressed in the first iteration. An exemplary method for minimizing the subproblem is described above in detail, particularly with reference to Eqns. (23)-(42). It will be appreciated by those skilled in the art, however, that the subproblem can be solved by any number of acceptable numerical methods. After the subproblem has been minimized, the solution is used to update the estimate image, as indicated at step 308. A determination is then made at decision block 310 whether an acceptable solution to the series of subproblems has been reached for the given scale parameter, σ. For example, when a global measure of the difference between sequential iterations falls below some level, $tol_{inner}$, according to:

$$tol_{inner} < \frac{\|u^i - u^{i-1}\|_2}{\|u^{i-1}\|_2}; \quad \text{Eqn. (47)}$$

the inner loop, including the iterative minimization of the series of subproblems, concludes. Exemplary values of $tol_{inner}$ include $1 \times 10^{-2}$. If this tolerance level is not met, then the next iteration of the minimization is selected at step 312 and steps 308-310 are repeated to produce the next update of the estimate image.

A determination is then made again at decision block 310 as to whether the solution is acceptable, that is, whether a potentially local minimum is found. When an acceptable solution for the subproblem is reached a determination is then made as to whether the solution is acceptable for the homotopic $l_0$ minimization, as indicated at decision block 314. Similar to the inner loop, a threshold, $tol_{outer}$, is set for the outer loop. When a global measure of the difference between sequential solutions to the inner loop falls below this threshold value, then the minimization process is complete and the image estimate deemed to be acceptable. For example, the following condition is evaluated:

$$tol_{outer} < \frac{\|u^k - u^{k-1}\|_2}{\|u^{k-1}\|_2}; \quad \text{Eqn. (48)}$$

where $u^k$ is the solution to the $k^{th}$ acceptable solution to the inner loop, and $u^{k=0}$ is equal to the initial image estimate selected in step 302. Exemplary values of $tol_{outer}$ include $1 \times 10^{-4}$. For each iteration of the outer loop, an acceptable solution to the inner loop minimization is produced. If the condition in Eqn. (48) is not satisfied, then the scale parameter, σ, is updated, as indicated at step 316, and the next iteration of the overall method is selected at step 318. It is noted that the scale parameter, σ, is updated, for example, by weighting it by a scale factor, $\beta \in (0,1)$, such that σ>β·σ. This scale factor, β, determines the rate of deformation of the prior term. Qualitatively, the scale factor, β, should balance rapid advancement of the algorithm while maintaining assurance that solutions of successive problems are adequately close. Exemplary values of the scale factor, β, include ($\sqrt{10}/10$) and 0.5.

In the foregoing manner, each solution determined by the inner loop is the solution to a subproblem given, for example, by Eqn. (22), for a selected value of the scale parameter, σ. The solution to this problem is subsequently used as the input to a computationally more difficult subproblem, defined by the updated scale parameter, β·σ. As described above in detail, this iterative process asymptotically approaches a solution to the $l_0$ minimization problem, and is referred to as homotopy or continuation. When the condition in Eqn. (48) is satisfied, an acceptable or stable solution to the homotopic $l_0$ minimization problem has been found. This updated image estimate, u, is subsequently stored as the reconstructed image of the subject, as indicated at step 320.

Application to Three-Dimensional Magnetic Resonance Angiography

Contrast-enhanced magnetic resonance angiography ("CE-MRA") is a powerful technique for non-invasively studying vessel morphology. State-of-the-art time-resolved image acquisition strategies such as CAPR, referred to above, and HYPR, described, for example, in U.S. Pat. No. 7,519, 412, now offer true three-dimensional imaging of vascular morphology and flow dynamics. In pursuit of higher frame rates, most contemporary time-resolved imaging methods employ "view-sharing," where only a subset of k-space is updated in each frame. Reducing the subset size permits an increased frame rate, but the "temporal footprint" of the sequence is consequently enlarged. As used herein, the term "temporal footprint" refers to the time window from which data acquired in a time-resolved imaging study is selected to be combined for image reconstruction. Ideally, an inverse relationship would exist between these variables.

Increasing frame rate without widening the temporal footprint requires auxiliary sources of acceleration. One approach of this acceleration is the use of compressed sensing, which as described above in detail is a recently introduced sampling theory asserting that near-exact signal recovery from only a limited sample set may be possible if the signal is sparse (or compressible) in some a priori known transform domain.

Relaxed sampling conditions and the ability to recover highly-undersampled signals practically translates to faster imaging. Moreover, as view-sharing is no longer necessary, the temporal footprint of a sequence would simply be the width of a single time frame. But these gains come at a cost and, unlike conventional MR imaging, a computationally-expensive nonlinear optimization routine is now required to reconstruct the image with compressed sensing methods. Single-channel true three-dimensional compressed sensing MRI reconstructions typically require several hours. Some have suggested separating the Cartesian three-dimensional problem into a series of two-dimensional problems. While this approach can improve computational performance, powerful three-dimensional connectivity information is inherently lost.

Parallel imaging is often used as am auxiliary source of acceleration. Recently, it has been suggested to combine parallel imaging with compressed sensing. While this union can lead to even greater accelerations, integrating multi-sensor data handling into the compressed sensing framework only augments the computational burden.

Images produced with CE-MRA techniques are dominated by morphological information and, thus, possess sparse spatial gradient representations. Consequently, a six-fold redundant (albeit non-invertible) transformation can be created using both forward and backward finite differences along each dimension to fully capture three-dimensional vascular connectivity. Additionally, the near-binary distribution of intensities, and thus gradients, in CE-MRA images can be exploited by employing the non-convex Laplace prior functional. For appropriate values of the scale parameter, $\sigma$, this functional is shown in Eqn. (16). The non-convex Laplace prior functional closely mimics the $l_0$-norm over the populated intensity windows.

Let $\eta$ denote the set of six first-order cardinal neighbors, which are the six voxel locations adjacent a given voxel location. The proposed model for three-dimensional parallel CE-MRA image recovery is now given by:

$$u_* = \underset{u}{\operatorname{argmin}} J(u, \sigma, \lambda); \qquad \text{Eqn. (49)}$$

where $J(u,\sigma,\lambda)$ is an energy functional having the form:

$$J(u, \sigma, \lambda) = \sum_{n \in \eta} \sum_{x \in \Omega} \rho(D_n u(x), \sigma) + \frac{\lambda}{2}\|\Phi u - \Phi f\|_2^2; \qquad \text{Eqn. (50)}$$

in which $D_n$ is a finite difference operator, with Neumann boundary conditions, for a neighbor, n. This energy functional can be solved using a quasi-Newton method similar to the one described above.

Figure 4:
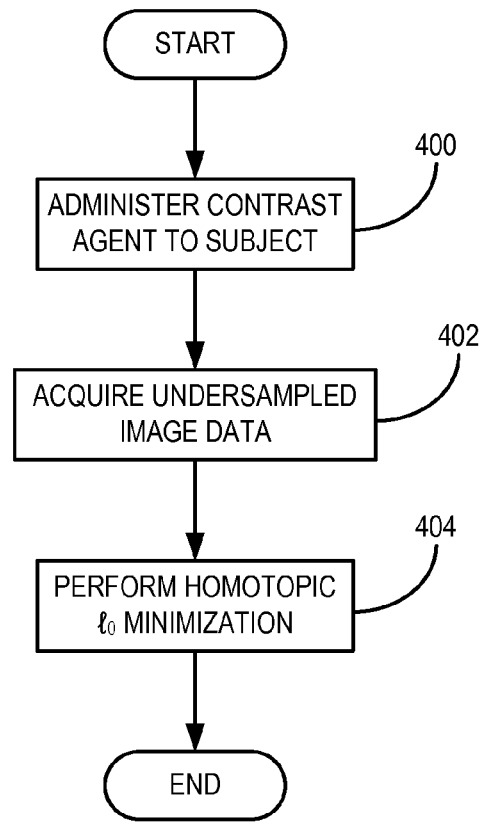
FIG. 4 is a flowchart setting forth the steps of an exemplary method for producing a three-dimensional contrast-enhanced magnetic resonance angiography images using the image reconstruction method illustrated in FIG. 3.

Referring now to FIG. 4, a flowchart setting forth the steps of an exemplary method for producing an image of a subject using contrast-enhanced magnetic resonance angiography ("CE-MRA") in accordance with the present invention is illustrated. The method begins with the administration of a contrast agent to the subject, as indicated at step 400. For example, a gadolinium-based contrast agent is administered intravenously to the subject. Following the administration of the contrast agent, undersampled image data is acquired from the subject during a passage of the contrast agent through a tissue of interest, as indicated at step 402. It is noted again that k-space can be significantly undersampled and, yet, clinically acceptable images can still be reconstructed in accordance with the present invention. Exemplary degrees of undersampling achievable with the present invention approach about 4 percent of the Nyquist criterion. An exemplary pulse sequence employed to acquire the undersampled image data is a Cartesian acquisition with projection reconstruction-like sampling ("CAPR") type pulse sequence, such as the one described, for example, by C. R. Haider, et al., in "3D High Temporal and Spatial Resolution Contrast-Enhanced MR Angiography of the Whole Brain," *Magnetic Resonance in Medicine,* 2008; 60:749-760. After the image data has been acquired, reconstruction begins.

Image reconstruction then proceeds using the homotopic $l_0$ minimization method, as indicated at step 404, and as described above with respect to FIG. 3. In the CE-MRA case, however, the following initial values were selected: the initial image estimate, $u^0$, is selected as a zero matrix; $\lambda=1\times10^{-3}$; and the scale parameter $\sigma=0.25$. It will be appreciated by those skilled in the art, however, that these initial values are only representative of one possible application and that many different variations are contemplated.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a medical imaging system, the steps of the method comprising:
    a) acquiring, with the medical imaging system, undersampled image data from the subject; and
    b) reconstructing an image of the subject from the acquired undersampled image data by iteratively minimizing an objective function that includes a concave metric prior that is homotopic with an $l_0$-norm.

2. The method as recited in claim 1 in which the concave metric prior in step b) includes a scale parameter.

3. The method as recited in claim 2 in which step b) includes reducing the scale parameter to a value closer to zero during each iteration such that the concave metric prior is continuously deformed towards the $l_0$-norm.

4. The method as recited in claim 2 in which step b) includes:
    b)i) producing a subproblem solution image by iteratively minimizing the concave metric prior;
    b)ii) updating the scale parameter by applying a weighting factor that reduces the scale parameter to a value that is closer to zero;
    b)iii) forming an updated concave metric prior using the updated scale parameter; and
    b)iv) producing an updated subproblem solution image by iteratively minimizing the updated concave metric.

5. The method as recited in claim 4 in which the updated concave metric prior asymptotically approaches an $l_0$-norm as the updated scale parameter approaches zero.

6. The method as recited in claim 1 in which the medical imaging system is a magnetic resonance imaging (MRI) system.

7. The method as recited in claim 6 further including administering a contrast agent to the subject before acquiring the undersampled image data.

8. The method as recited in claim 7 in which the undersampled image data is acquired in step a) by directing the MRI system to perform a pulse sequence that samples k-space in three-dimensions, and the image of the subject that is reconstructed in step b) is a three-dimensional image indicative of the subject's vasculature.

9. The method as recited in claim 8 in which the acquired undersampled image data is undersampled by a factor down to around 4 percent of a Nyquist criterion.

10. The method as recited in claim 1 in which the medical imaging system is an x-ray computed tomography (CT) system and a radiation dose to the subject is reduced relative to a degree of undersampling of the acquired undersampled image data.

11. The method as recited in claim 1 in which the acquired undersampled image data is undersampled by a factor down to around 4 percent of a Nyquist criterion.

12. The method as recited in claim 11 in which the acquired undersampled image data includes samplings in three dimensions, and the image of the subject reconstructed in step b) is a three-dimensional image of the subject.

13. The method as recited in claim 1 in which the objective function in step b) has the form:

$$\rho(|\Psi u|, \sigma);$$

wherein:
- $\rho(\ldots)$ is the concave metric prior;
- $\Psi$ is a sparsifying transform;
- u is an estimate of the reconstructed image;
- $\sigma$ is a scale parameter that when tended to zero causes the concave metric prior, $\rho(\ldots)$, to be continuously deformed towards the $l_0$-norm.

14. A method for producing an image of a tissue of interest in a subject with a magnetic resonance imaging (MRI) system, the steps of the method comprising:
   a) administering a contrast agent to the subject;
   b) acquiring, with the MRI system, undersampled image data from the subject during a passage of the contrast agent through the tissue of interest;
   c) reconstructing an image of the tissue of interest from the acquired undersampled image data by iteratively minimizing an objective function that includes a concave metric prior that is homotopic with an $l_0$-norm.

15. The method as recited in claim 14 in which step b) includes directing the MRI system to perform a pulse sequence that samples k-space in three dimensions, and the image of the subject reconstructed in step c) is a three-dimensional image indicative of the tissue of interest.

16. The method as recited in claim 14 in which the acquired undersampled image data is undersampled by a factor down to around 4 percent of a Nyquist criterion.

17. The method as recited in claim 16 in which step b) includes directing the MRI system to perform a pulse sequence that undersamples k-space in three dimensions, and the image of the subject reconstructed in step c) is a three-dimensional image indicative of the tissue of interest.

18. The method as recited in claim 12 in which the concave metric prior includes a scale parameter, and step c) includes:
   c)i) producing a subproblem solution image by iteratively minimizing the concave metric prior;
   c)ii) updating the scale parameter by applying a weighting factor that reduces the scale parameter to a value that is closer to zero;
   c)iii) forming an updated concave metric prior using the updated scale parameter; and
   c)iv) producing an updated subproblem solution image by iteratively minimizing the updated concave metric.

19. The method as recited in claim 12 in which the objective function in step c) has the form:

$$\rho(|\Psi u|, \sigma);$$

wherein:
- $\rho(\ldots)$ is the concave metric prior;
- $\Psi$ is a sparsifying transform;
- u is an estimate of the reconstructed image; and
- $\sigma$ is a scale parameter that when tended to zero causes the concave metric prior, $\rho(\ldots)$, to be continuously deformed towards the $l_0$-norm.

* * * * *